US008815668B2

(12) United States Patent
Basker et al.

(10) Patent No.: US 8,815,668 B2
(45) Date of Patent: Aug. 26, 2014

(54) PREVENTING FIN EROSION AND LIMITING EPI OVERBURDEN IN FINFET STRUCTURES BY COMPOSITE HARDMASK

(71) Applicant: International Business Machines Corporation, Armonk, NY (US)

(72) Inventors: Veeraraghavan S. Basker, Schenectady, NY (US); Effendi Leobandung, Wappingers Falls, NY (US); Tenko Yamashita, Schenectady, NY (US); Chun-chen Yeh, Clifton Park, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/708,126

(22) Filed: Dec. 7, 2012

(65) Prior Publication Data

US 2014/0159166 A1 Jun. 12, 2014

(51) Int. Cl.
*H01L 21/336* (2006.01)
(52) U.S. Cl.
USPC ............................ 438/197; 438/585; 257/347
(58) Field of Classification Search
USPC ............ 438/157, 197, 232, 513, 585; 257/29, 257/347, 351; 252/79.3
See application file for complete search history.

(56) References Cited

U.S. PATENT DOCUMENTS

| 7,094,650 | B2 | | 8/2006 | Chaudhary et al. |
| 7,198,995 | B2 | | 4/2007 | Chidambarrao et al. |
| 7,608,890 | B2 | * | 10/2009 | Yagishita ........................ 257/347 |
| 7,737,501 | B2 | * | 6/2010 | Zhu et al. ........................ 257/365 |
| 7,811,890 | B2 | | 10/2010 | Hsu et al. |
| 7,939,862 | B2 | | 5/2011 | Moroz et al. |
| 7,947,589 | B2 | * | 5/2011 | Muralidhar et al. .......... 438/585 |
| 7,948,307 | B2 | | 5/2011 | Chang et al. |
| 8,043,920 | B2 | | 10/2011 | Chan et al. |
| 8,169,025 | B2 | * | 5/2012 | Bedell et al. ................... 257/351 |
| 8,193,080 | B2 | * | 6/2012 | Sasaki et al. .................. 438/513 |
| 8,278,707 | B2 | | 10/2012 | Fehlhaber et al. |
| 2004/0259303 | A1 | * | 12/2004 | Lee et al. ....................... 438/232 |
| 2008/0210900 | A1 | * | 9/2008 | Wojtczak et al. ............. 252/79.3 |

(Continued)

OTHER PUBLICATIONS

Virani et al., Double Dielectric Spacer for the Enhancement of Silicon p-Channel Tunnel Field Effect Transistor Performance, Japanese Journal of Applied Physics 50 (2011) 04DC04-1 to 04DC04-6.*

(Continued)

*Primary Examiner* — Charles Garber
*Assistant Examiner* — Syed Gheyas
(74) *Attorney, Agent, or Firm* — Harrington & Smith

(57) ABSTRACT

A FinFET structure is formed by forming a hardmask layer on a substrate including a silicon-containing layer on an insulating layer. The hardmask layer includes first, second and third layers on the silicon-containing layer. An array of fins is formed from the hardmask layer and the silicon-containing layer. A gate is formed covering a portion but not all of a length of each of the array of fins. The portion covers each of the fins in the array. The gate defines source/drain regions on either side of the gate. A spacer is formed on each side of the gate, the forming of the spacer performed to remove the third layer from portions of the fins in the source/drain regions. The second layer of the hardmask layer is removed from the portions of the fins in the source/drain regions, and the fins in the source/drain regions are merged.

20 Claims, 4 Drawing Sheets

(56) References Cited

U.S. PATENT DOCUMENTS

| | | | |
|---|---|---|---|
| 2010/0102389 | A1 | 4/2010 | Muller et al. |
| 2010/0193840 | A1 | 8/2010 | Doyle et al. |
| 2011/0006369 | A1* | 1/2011 | Sonsky et al. .......... 257/347 |
| 2011/0018064 | A1* | 1/2011 | Doornbos .............. 257/365 |
| 2011/0111596 | A1 | 5/2011 | Kanakasabapathy |
| 2011/0133292 | A1 | 6/2011 | Lee et al. |
| 2012/0091538 | A1 | 4/2012 | Lin et al. |
| 2012/0175749 | A1 | 7/2012 | Haensch et al. |
| 2012/0280331 | A1 | 11/2012 | Ou et al. |
| 2012/0298965 | A1* | 11/2012 | Haensch et al. .......... 257/29 |
| 2013/0149851 | A1* | 6/2013 | Li et al. .................. 438/585 |

OTHER PUBLICATIONS

N. Horiguchi et al., "High yield sub-0.1μm2 6T-SRAM cells, featuring high-k/metal-gate finfet devices, double gate patterning, a novel fin etch strategy, full-field EUV lithography and optimized junction design & layout,"), 2010 Symposium on VLSI Technology, VLSIT, Jun. 15-17, 2010, pp. 23-24.

G. Zschätzsch et al., "Novel Approach to Conformal FINFET Extension Doping," 18th International Conference on Ion Implantation Technology IIT 2010, Issue Date: Jan. 7, 2011, pp. 23-26.

* cited by examiner

PREVENTING FIN EROSION AND LIMITING EPI OVERBURDEN IN FINFET STRUCTURES BY COMPOSITE HARDMASK

BACKGROUND

This invention relates generally to FinFETs (Field Effect Transistors, FETs, with fins) and, more specifically, relates to preventing fin erosion and limiting EPI (epitaxial) overburden in FinFETs.

At the end of this disclosure, a list of abbreviations is presented. This list contains many of the abbreviations used herein and in the drawing figures.

FIN erosion during RIE to form a first set of spacers ("spaced") on a gate of the FinFET is one of the key issues in SOI FinFET. Fin attack during the spacer pull down leads to a reduction in active carrier dose and increased access resistance. That is, spacer pull down is the removal (e.g., via RIE) of the spacer material so that the spacer material is left as a spacer on a side of the gate. The RIE is isotropic, so spacer pull down can over etch certain areas. Thus, the RIE for this pull down typically also attacks the Si fins, such that the fin height in the S/D areas is lower than the fin height in the gate region (as the fins are protected at least by the gate material in the gate region). The removal of material from the Si fins in the S/D regions leads to the reduction in active carrier dose and increased access resistance. Hardware data suggests by minimizing the Si loss to the fins in the source/drain regions, Ieff (effective switching current) improves with Rext (external resistance) reduction.

Besides, it is critical to reduce the epitaxial overgrowth on top of the fin in the SD region. Excess epitaxial overburden occurs when lateral growth of Si from the sides of the fins to create merged fins also causes vertical growth of Si from the top of the fins. Excess epitaxial overburden leads to increase of fringing capacitance from PC (e.g., gate) to the epitaxial overgrowth. The overburden also affects a profile of a second set of spacers ("spacer2") on the gate and may lead to shorts from the gate to the S/D regions.

SUMMARY

In an exemplary embodiment, a method is disclosed for forming a FinFET structure. The method includes forming a hardmask layer on a substrate. The substrate comprises a silicon-containing layer on an insulating layer. The hardmask layer comprises first, second and third layers. The first layer is formed on the silicon-containing layer, the second layer is formed on the first layer, and the third layer is formed on the second layer. The method includes forming an array of fins from the hardmask layer and the silicon-containing layer, and forming a gate covering a portion but not all of a length of each of the array of fins. The portion covers each of the fins in the array. The gate defines source/drain regions on either side of the gate. The method includes forming a spacer on each side of the gate, the forming of the spacer performed to remove the third layer from portions of the fins in the source/drain regions, removing the second layer of the hardmask layer from the portions of the fins in the source/drain regions, and merging the fins in the source/drain regions to create merged fins in the source/drain regions.

In another exemplary embodiment, a FinFET structure is disclosed. The FinFET structure includes a substrate including a silicon-containing layer on an insulating layer and an array of fins formed to include the silicon-containing layer. The FinFET structure includes a gate covering a portion but not all of a length of each fin in the array of fins. The portion covers each of the fins in the array. The gate defines source/drain regions on either side of the gate. The FinFET structure includes a spacer on each side of the gate, wherein the spacer and the gate cover a hardmask layer formed on the fins in the array. The hardmask layer includes first, second and third layers on the silicon-containing layer. The first layer is formed on the silicon-containing layer. The second layer is formed on the first layer. The third layer is formed on the second layer. The FinFET structure includes merged fins in the source/drain regions, wherein at least the second and third layers of the hardmask layer do not cover portions of the fins in the source/drain regions.

DETAILED DESCRIPTION

In this invention, techniques are proposed to prevent FIN erosion during spacer pull down and to limit the epi overburden. These are achieved by forming, in an exemplary embodiment, a nitride-oxide-nitride (NON) composite hardmask on top of the fins. The top SiN and the oxide cap prevent the FIN erosion from PC/spacer1 RIE. And the bottom SiN HM limits epitaxial growth from the top of the fin, thus helping to minimize epitaxial overburden.

Figure 1:
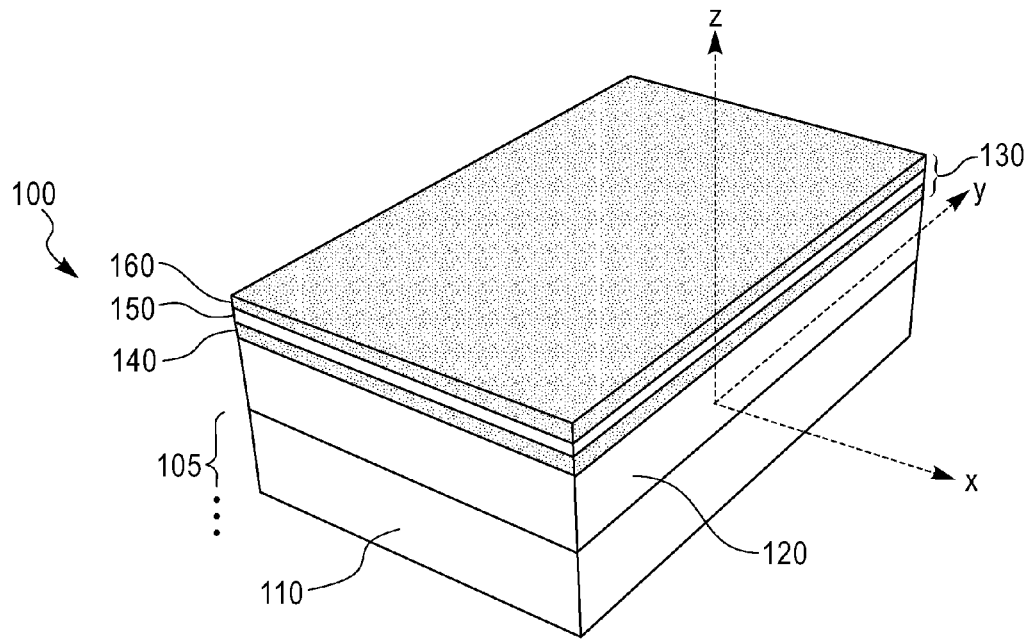
FIGS. 1-4 are perspective views of semiconductor material at various stages of FinFET structure formation in accordance with an exemplary embodiment.

FIGS. 1-4 are perspective views of semiconductor material 100 at various stages of FinFET structure formation in accordance with an exemplary embodiment. FIG. 1 illustrates an early stage of FinFET structure formation. In particular, FIG. 1 illustrates NON cap deposition before an a-Si mandrel and MLD (Molecular Layer Deposition) SIT spacer formation. The use of MLD is to achieve better conformality than other techniques. An exemplary embodiment of MLD involves alternate processing of Dichlorosilane (DCS) and Ammonia (NH3) used in a mini-batch furnace to deposit thin layers of silicon nitride (SiN). In FIG. 1, a substrate 105 of the semiconductor material 100 includes an insulating BOX layer 110. An SOI layer 120, containing Si in a crystalline formation, is formed on and in contact with the BOX layer 110. The SOI layer 120 may or may not be doped. For instance, some low threshold voltage (Vt) devices may not be doped, while some high threshold devices may be doped. An exemplary thickness of the SOI layer 120 is greater than or equal to 25 nm. The dopant could include, e.g., boron for an NFET or, e.g., phosphorous for a PFET. A NON layer (e.g., "NON cap") 130 is formed on and in contact with the SOI layer 120. The NON layer 130 is a multiple-layer hardmask. Exemplary layers and exemplary reasons for the layers in NON layer 130 are described in more detail below. The NON layer 130 comprises, in an example, a first layer 140 (e.g., a first SiN layer) formed on and in contact with the SOI layer 120, a second layer 150 e.g., an oxide layer) formed on and in contact with the first SiN layer 140, and a third layer 160 (e.g., a second SiN layer) formed on and in contact with the oxide layer 150.

In an exemplary embodiment, each of the layers 140, 150, 160 is 10 nm (nanometers) or less, although the layers could be thicker.

Figure 2:
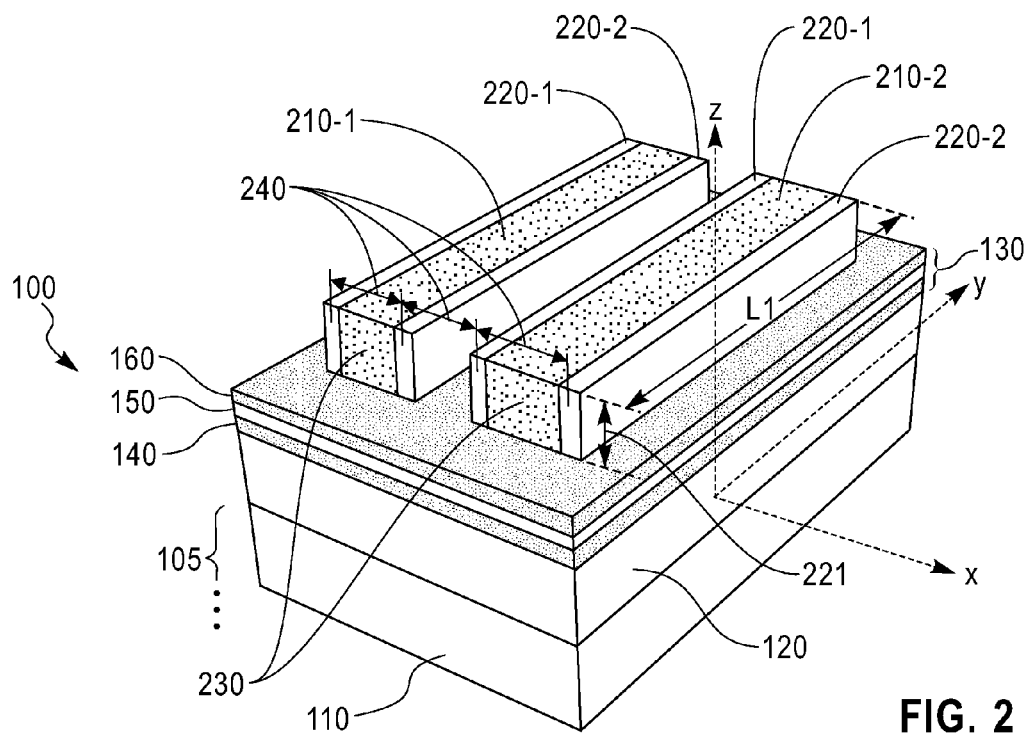

FIG. 2 illustrates a stage subsequent to the stage illustrated by FIG. 1 of FinFET structure processing. In particular, this example illustrates a SIT spacer etch and mandrel pull, followed by an FH lithography. FH refers to a mask layer used to define a mandrel. That is, the semiconductor material 100 is shown after formation of an a-Si layer 230 and subsequent removal (e.g., via etching) to form the a-Si mandrels 210, of which two (210-1 and 210-2) are shown. Formation of the a-Si mandrels 210 is referred to as a mandrel pull herein. SIT spacers 220-1 and 220-2 are formed on each mandrel 210. Each SIT spacer is formed about a pitch 240 apart. The formation includes a deposition of a spacer layer (the SIT spacers 220 may be made of SiN) flowed by a SIT spacer etch, such as an RIE. The thickness 221 is defined (as is the SIT spacer RIE) so that the SIT spacer etch used to form the fins is able to remove the SIT spacers 220 and form the fins 310, including etching of the NON layer 130 and the SOI layer 120 to the surface 111 (see FIG. 3) of the BOX layer 110. In an example, the thickness 221 is about 20 nm.

The FH lithography is performed at least to cut the mandrels 210 and corresponding SIT spacers 220 to a length ("L1"). The SIT spacers 220 define an extent (at least in part) of the fins (see FIG. 3).

Figure 3:
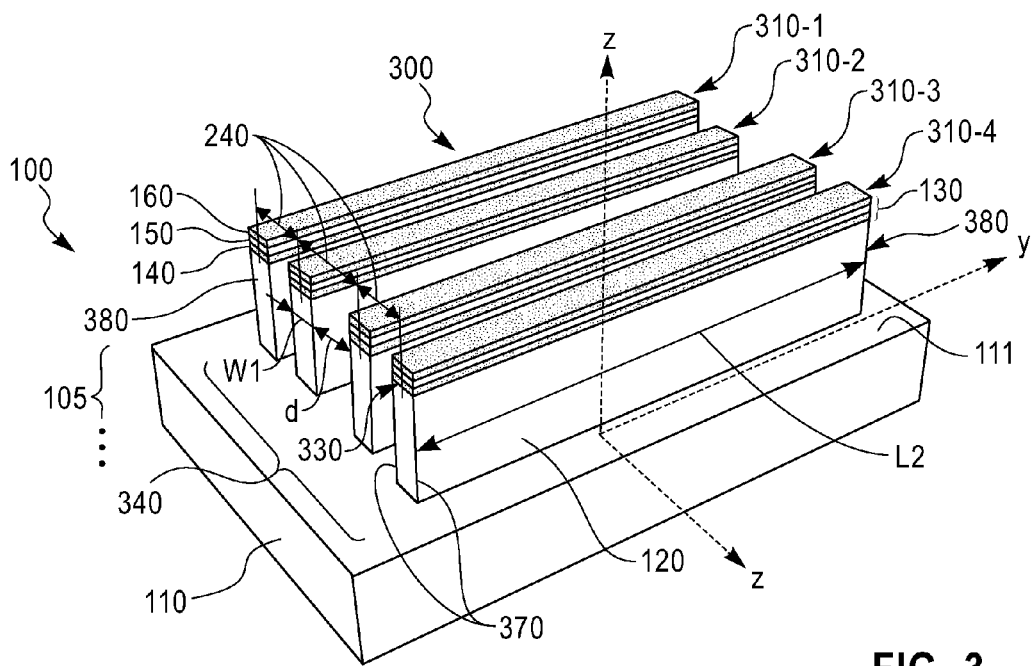

FIG. 3 illustrates the semiconductor material 100 after removal of the mandrels 210 via, e.g., an RIE. The RIE is designed such that removal of Si in the SOI layer 120 occurs, as does removal of the NON layer 130 and removal of the SIT spacers 220. The RIE stops on the BOX layer 110, e.g. at the surface 111. Thus, the SIT spacers 220 at least partially define the extent of their corresponding fins 310 and the array 340 of fins. That is, SIT spacer 220-1 of mandrel 210-1 at least partially defines the extent of the fin 310-1; SIT spacer 220-2 of mandrel 210-1 at least partially defines the extent of the fin 310-2; SIT spacer 220-1 of mandrel 210-2 at least partially defines the extent of the fin 310-3; and SIT spacer 220-2 of mandrel 210-2 at least partially defines the extent of the fin 310-4. There may also be fins that occur in areas other than device areas. Consequently, Si-ARC and ODL processing may be performed to remove the excess fins and also to cut the remaining fins to the correct length.

In this example, the array 340 of fins has four fins 310 parallel to each other along a first axis (Y) and spaced (e.g., center to center) by the fin pitch 240 along a second axis (X) and by a distance, d. Each fin 310 has a width, W1, and a length, L2, where the length L2 is much greater than W1. W1 ranges from 8-12 nm. L2 is in the range of 500 nm to 1 um. Each of the fins 310 has sides 370 parallel to the long axis and to each fin, and has sides 380 at the longitudinal ends of the fins 310.

The array 340 forms part of a FinFET structure 300. Each of the fins 310 still has the NON layer 130 covering a top portion 330 of the fin.

Figure 4:
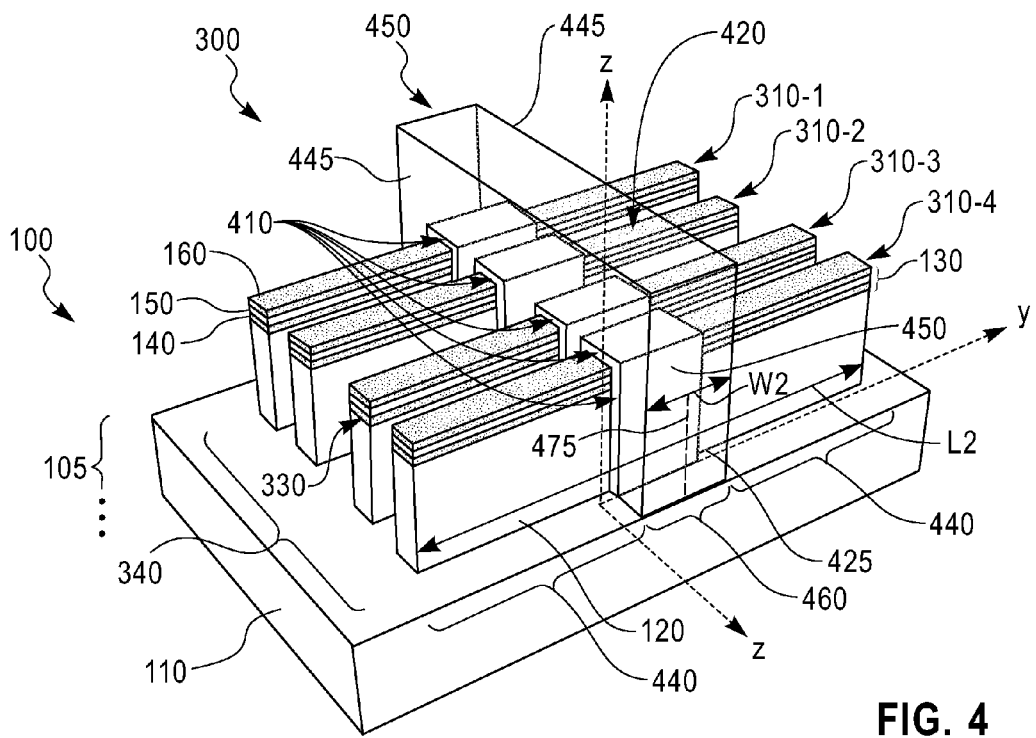

FIG. 4 illustrates the semiconductor material 100 after PC/HKMG 410 formation followed by gate patterning of the gate material layer 425 to form the gate 420, which also defines the S/D regions 440. The HKMG layer 410 is formed, then the gate material layer 425 (e.g., comprising polysilicon) is formed. The HKMG layer 410 may comprise a high-k dielectric, which can be $HfO_2$, $Al_2O_3$, $La_2O_3$ and the metal layer candidates include TiN, TaN, TaAlN, TiC, as examples. The PC RIE (to pattern the HKMG layer 410 and the gate 420) stops on the surface 11 of the BOX layer 110 and on the SiN cap (i.e., second SiN layer 160) to prevent erosion of the fin oxide layer 150. That is, the SiN layer 160 prevents fin erosion during the patterning of the gate 420. The PC RIE defines the extent of the gate 420, e.g., by forming the gate material 420 with sides 445 facing the S/D regions 440 and the sides 450 parallel to the sides of the fins. The gate 420 has a width W2 and is formed in a gate region 460. W2 can be from approximately 18-22 nm. The gate 420 is typically placed such that axis 475 is situated (e.g., along the Y axis) at W2/2 and L2/2. Put another way, if the axis 475 is situated at zero on the Y axis, the gate 420 extends W2/2 in each of the +Y and −Y directions and each fin 310 extends L2/2 in each of the +Y and −Y directions.

Figure 5A:
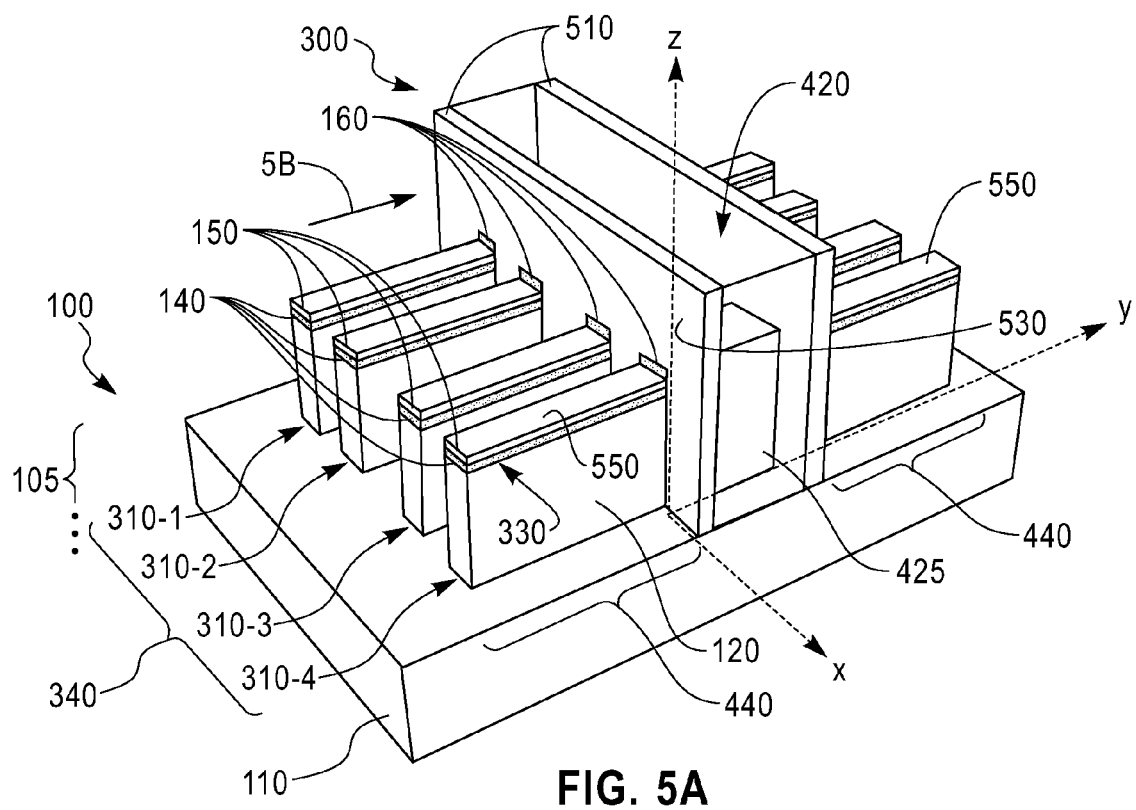
FIG. 5A is a perspective view and FIG. 5B is a side view of the semiconductor material at a stage of FinFET structure formation in accordance with an exemplary embodiment.
Figure 5B:
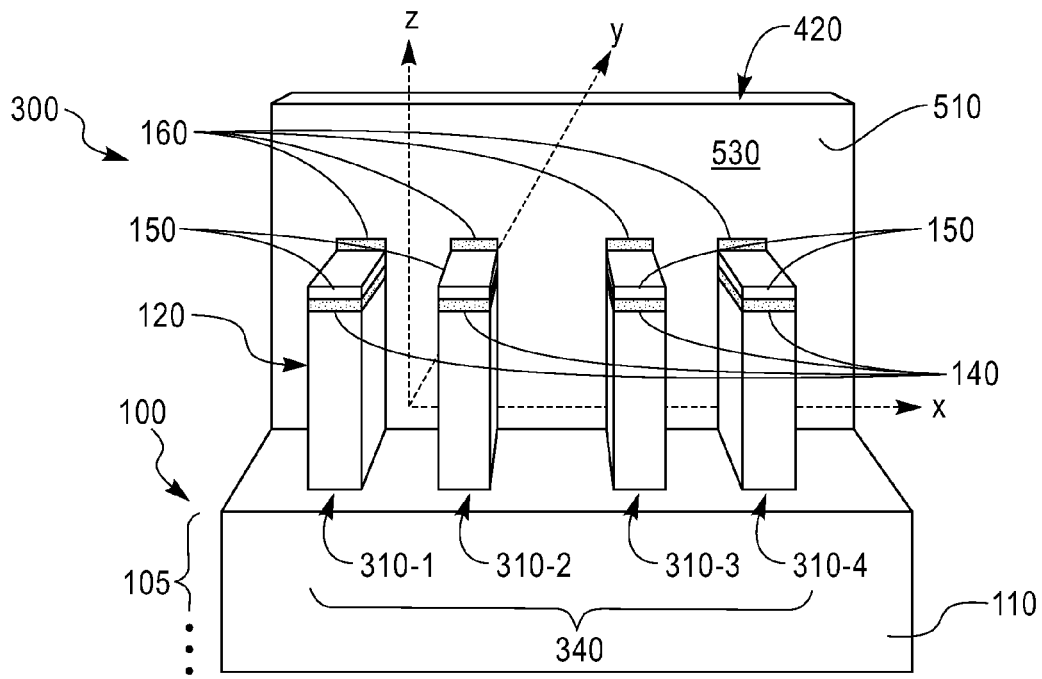

Turning to FIGS. 5A and 5B, FIG. 5A is a perspective view and FIG. 5B is a side view (indicated by arrow 5B shown in FIG. 5A) of the semiconductor material at a stage of FinFET structure formation in accordance with an exemplary embodiment. The FinFET structure 300 is shown after iRAD spacer 510 formation on the sides 445 of the gate material layer 425. The iRAD spacer 510 (e.g., "spaced") is formed by forming a layer (e.g., SiN) via an iRAD process, which creates a very conformal layer and a dense film for the spacer layer from which spacers 510 are formed. The spacers 510, each having a surface 530, are formed by performing a spacer RIE for spacer pull down and to remove the top SiN cap (i.e., the third layer 160, which in an example is a second SiN layer) in the S/D regions 540 prior to ISD epitaxial growth. The spacer RIE ends on a top surface 550 of the oxide layer 150 and the second SiN layer 160 is removed in the S/D regions 540. Techniques other than iRAD may be used to create the layer 510, such as LPCVD. However, the third layer 160 remains under the iRAD spacers 510 formed on either side 445 of the gate material layer 425 and under the HKMG layer 410.

Figure 6A:
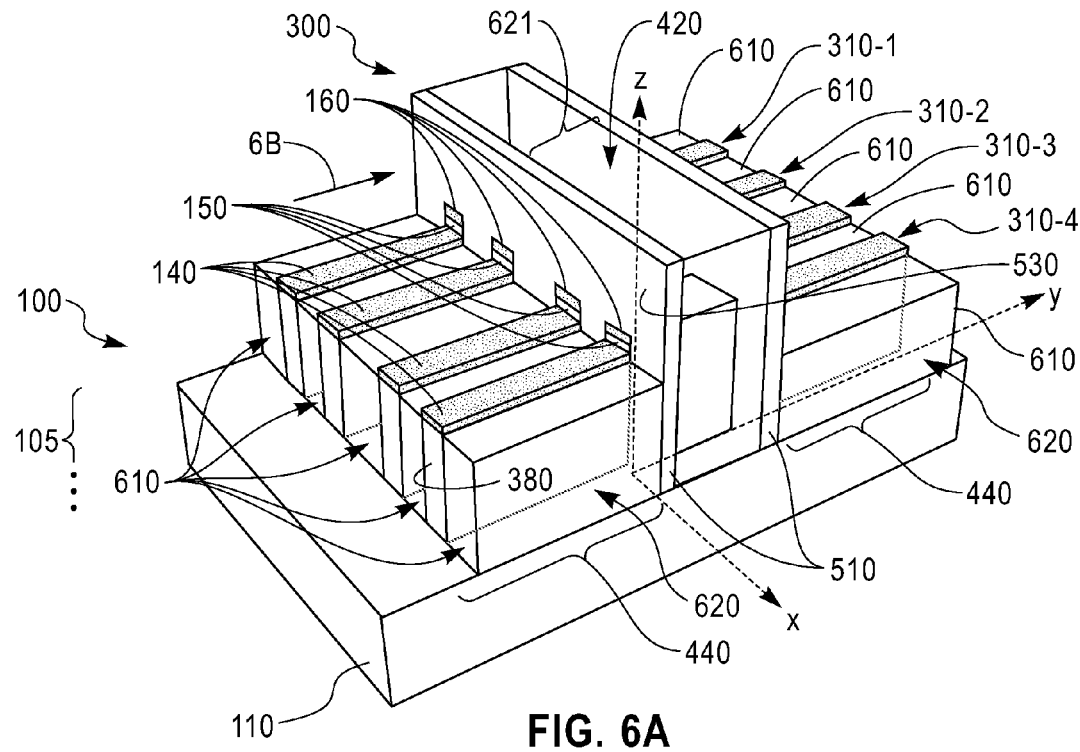
FIG. 6A is a perspective view and FIG. 6B is a side view of the semiconductor material at a stage of FinFET structure formation in accordance with an exemplary embodiment.
Figure 6B:
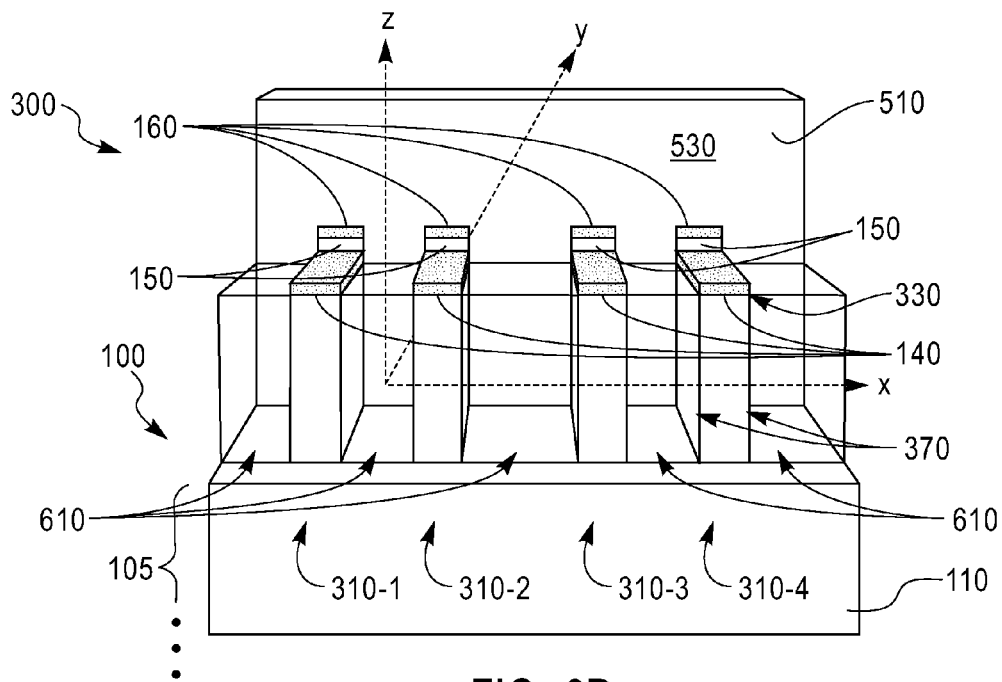

Referring now to FIGS. 6A and 6B, FIG. 6A is a perspective view and FIG. 6B is a side view of the semiconductor material 100 at a stage of FinFET structure formation in accordance with an exemplary embodiment. The second layer 150 is removed during epitaxy preclean for merged epitaxial growth. The second layer 150 may be an oxide layer 150 that may be removed using, e.g., an HF wet etch. There may be some effect (e.g., about the thickness of the oxide layer 150) on the BOX layer 110, but an effect of a loss of a typical thickness (e.g., 10 nm) of the oxide layer 150 on the BOX layer 110 should be small. The merged epitaxial growth creates merged fins 620 including the merged fin areas 610 and the original fins 310 (e.g., layer 120 of the original fins 310) in the S/D regions 440. An exemplary technique for merged epitaxial growth is an in-situ doped Si-epitaxial growth process. The merged epitaxial growth serves the purpose of dopant source for extension drive-in and junction formation. The dopant used may be, e.g., phosphorous for an NFET or, e.g., boron for a PFET. The merged fin areas 610 are caused by horizontal growth from the sides 370 of the fins 310. The first SiN layer 140 prevents epitaxial growth from the top 330 of the fins 310, thus helping minimize epitaxial overburden. It is noted there may be some epitaxial growth on sides 380 of the fins 310, depending on the configuration. However, this epitaxial growth is not expected to be problematic (and would also occur without the first SiN layer 140).

The first (e.g., SiN) layer 140 may or may not be removed, although typically, this layer would be removed. For instance, there is typically a second spacer ("spacer2") formation (e.g., deposition and etch), and this etch process may be used to remove the first SiN layer 140. The second spacer may be comprised of SiN. There could be an S/D implant. There could also be an S/D thermal process (e.g., spike anneal) to drive dopants from the S/D region 440 toward the channel region 621 for extension overlap and/or to drive the dopants into the SOI layer 120 of the fins 310, and there could also be a laser anneal for activation of the dopant. Typically, both an in-situ doped epitaxial process and a subsequent S/D implant are used.

While the present invention has been particularly shown and described with respect to preferred embodiments thereof, it will be understood by those skilled in the art that the foregoing and other changes in forms and details may be made without departing from the spirit and scope of the present invention. It is therefore intended that the present invention not be limited to the exact forms and details described and illustrated, but fall within the scope of the appended claims.

The following abbreviations that may be found in the specification and/or the drawing figures are defined as follows:

| | |
|---|---|
| ARC | Anti-Reflective Coating |
| a-Si | amorphous Silicon |
| BOX | Buried OXide |
| EPI or epi | Epitaxial |
| FET | Field Effect Transistor |
| HF | Hydrofluoric acid |
| HKMG | High-k Metal Gate |
| Ieff | effective switching current |
| iRAD | in-situ Radical Assisted Deposition |
| LPCVD | Low Pressure Chemical Vapor Deposition |
| MLD | Multi-Layer Deposit |
| NFET | n-type (e.g., negative channel) FET |
| NON | Nitride Oxide Nitride |
| ODL | Optical Dispersive Layer |
| PFET | p-type (e.g., positive channel) FET |
| iRAD | in-situ Radical Assisted Deposition |
| Rext | external resistance |
| RIE | Reactive Ion Etch(ing) |
| S/D | Source/Drain |
| Si-ARC | Silicon-containing ARC |
| SIT | Sidewall Image Transfer |
| SOI | Silicon-On-Insulator |

What is claimed is:

1. A method for forming a FinFET structure, comprising:
   forming a hardmask layer on a substrate, wherein the substrate comprises a silicon-containing layer on an insulating layer, wherein the hardmask layer comprises first, second and third layers, and wherein the first layer is formed on and in contact with the silicon-containing layer, the second layer is formed on the first layer, and the third layer is formed on the second layer;
   forming an array of fins from the hardmask layer and the silicon-containing layer;
   forming a gate covering a portion but not all of a length of each of the array of fins, the portion covering each of the fins in the array, the gate defining source/drain regions on either side of the gate;
   forming a spacer on each side of the gate, the forming of the spacer performed to remove the third layer from portions of the fins in the source/drain regions;
   removing the second layer of the hardmask layer from the portions of the fins in the source/drain regions; and
   merging the fins in the source/drain regions to create merged fins in the source/drain regions.

2. The method of claim 1, wherein forming the array of fins further comprises performing silicon-containing anti-reflective coating and optical dispersive layer processing to remove excess fins in non-device areas and to cut remaining fins to a length.

3. The method of claim 1, wherein forming the gate further comprises forming a high-k metal gate layer covering the array of fins, forming a gate material covering the high-k metal gate layer, and removing the high-k metal gate layer and the gate material from the portion of the fins in the source/drain regions.

4. The method of claim 1 wherein removing the second layer further comprises performing a wet etch to remove the second layer of the hardmask layer from portions of the fins in the source/drain regions.

5. The method of claim 4, wherein performing the wet etch also performs a preclean prior to merging the fins.

6. The method of claim 1 wherein the fins have a width prior to merging between approximately 8 nm to approximately 12 nm.

7. The method of claim 1 wherein merging the fins further comprises performing an in-situ doped Si-epitaxial growth process.

8. The method of claim 7, wherein:
   the silicon-containing layer comprises a crystalline silicon layer;
   performing the in-situ doped Si-epitaxial growth process uses an n-type dopant; and
   the FinFET structure is an NFET structure.

9. The method of claim 8, wherein the crystalline silicon layer is doped with a p-type dopant.

10. The method of claim 7, wherein:
    silicon-containing layer comprises a crystalline silicon layer;
    performing the in-situ doped Si-epitaxial growth process uses an p-type dopant; and
    the FinFET structure is a PFET structure.

11. The method of claim 1 wherein the spacer is a first spacer, and wherein the method further comprises forming a second spacer on an exposed side of each of the first spacers.

12. The method of claim 11, wherein forming the second spacer on an exposed side of each of the first spacers further comprises removing the first layer in the source/drain regions from the fins.

13. The method of claim 11, further comprising performing at least one anneal subsequent to forming the second spacer.

14. The method of claim 1 wherein the first and third layers comprise silicon nitride and the second layer comprises silicon oxide.

15. The method of claim 2, wherein the length is between 500 nanometers to 1 micrometer.

16. The method of claim 3, wherein the gate material comprises polysilicon.

17. The method of claim 16, wherein the high-k metal gate layer comprises a high-k dielectric comprising one or more of $HfO_2$, $Al_2O_3$, and $La_2O_3$.

18. The method of claim 17, wherein the high-k metal gate layer comprises a metal layer comprising one or more of TiN, TaN, TaAlN, and TiC.

19. The method of claim 1, wherein forming the gate forms the gate to have a width between approximately 18 nm to approximately 22 nm.

20. The method of claim 13, wherein the at least one anneal comprises one or both of a spike anneal and a laser anneal.

* * * * *